US008067927B2

United States Patent
Wu et al.

(10) Patent No.: US 8,067,927 B2
(45) Date of Patent: Nov. 29, 2011

(54) DIGITAL PWM CONTROLLER

(75) Inventors: Wenkai Wu, East Greenwich, RI (US); George Schuellein, Narragansett, RI (US)

(73) Assignee: International Rectifier Corporation, El Segundo, CA (US)

( * ) Notice: Subject to any disclaimer, the term of this patent is extended or adjusted under 35 U.S.C. 154(b) by 387 days.

(21) Appl. No.: 11/775,573

(22) Filed: Jul. 10, 2007

(65) Prior Publication Data

US 2008/0012742 A1 Jan. 17, 2008

Related U.S. Application Data

(60) Provisional application No. 60/819,873, filed on Jul. 11, 2006.

(51) Int. Cl.
*G05F 1/00* (2006.01)
*H03M 1/00* (2006.01)
*H03M 1/82* (2006.01)

(52) U.S. Cl. ......... 323/283; 323/284; 341/142; 341/152

(58) Field of Classification Search .......... 323/282–285, 323/269, 271, 272; 241/142, 152; 341/142, 341/152
See application file for complete search history.

(56) References Cited

U.S. PATENT DOCUMENTS

| 6,670,794 | B1 * | 12/2003 | Wang et al. | 323/213 |
| 6,850,046 | B2 * | 2/2005 | Chapuis | 323/282 |
| 7,479,772 | B2 * | 1/2009 | Zane et al. | 323/272 |
| 2003/0006650 | A1 * | 1/2003 | Tang et al. | 307/43 |
| 2004/0046535 | A1 | 3/2004 | Duffy et al. | |
| 2007/0013350 | A1 | 1/2007 | Tang et al. | |
| 2007/0085720 | A1 * | 4/2007 | Fosler | 341/155 |
| 2007/0200538 | A1 | 8/2007 | Tang et al. | |

* cited by examiner

*Primary Examiner* — Adolf Berhane
*Assistant Examiner* — Emily Pham
(74) *Attorney, Agent, or Firm* — Farjami & Farjami LLP

(57) ABSTRACT

A control circuit for a multi-phase converter including an analog front-end circuit for receiving and processing an output voltage and current of the converter circuits and an average output current; a digital circuit for producing an output voltage reference for setting a desired output voltage of the converter; and an error circuit for comparing the output voltage reference and a parameter related to said output voltage and current for generating control signals for controlling the converter circuits, said error circuit including an Analog to Digital Converter circuit, further comprising a digital PWM generation circuit controlled by said Analog to Digital converter circuit for generating digital control signals for controlling the converter circuits.

14 Claims, 3 Drawing Sheets

DIGITAL PWM CONTROLLER

CROSS-REFERENCE TO RELATED APPLICATION

This application is based on and claims priority to U.S. Provisional Patent Application Ser. No. 60/819,873, filed on Jul. 11, 2006 and entitled DIGITAL PWM CONTROLLER WITH AVP AND CURRENT SHARING CAPABILITY, the entire contents of which are incorporated by reference herein.

BACKGROUND OF THE INVENTION

The present invention relates to voltage converters and more particularly to a voltage converter circuit employing digital PWM control.

To achieve current sharing among the converter circuits of a multi-phase converter, traditional or conventional scalable analog PWM control circuits are implemented with a dedicated shared bus. Use of digital PWM control circuits offers potential advantages of lower sensitivity to parameter variations, programmability, and possibilities of improved performance through the use of more advanced control schemes.

In a conventional analog PWM control circuit, Active Voltage Positioning (AVP) or desired output voltage and current characteristics are achieved by introduction of both voltage and current loops. In a digital PWM control circuit, due to the power dissipation of a high speed Analog to Digital Converter (ADC) circuit, it is preferred to use only one ADC circuit to achieve desired AVP or voltage and current characteristics.

SUMMARY OF THE INVENTION

It is an object of the present invention to provide a simple and viable digital controller for a multi-phase converter having a current sharing arrangement and employs digital PWM control.

A control circuit for a multi-phase converter is presented. The control circuit includes an analog front-end circuit for receiving and processing an output voltage and current of the converter circuits and an average output current; a digital circuit for producing an output voltage reference for setting the desired output voltage; and an error circuit for comparing the output voltage reference and a parameter related to said output voltage and current for generating digital PWM control signals for controlling the converter circuits, said circuit including an Analog to Digital Converter circuit, further comprising a digital PWM generation circuit controlled by said Analog to Digital converter circuit for generating said digital PWM control signals.

Other features and advantages of the present invention will become apparent from the following description of the invention that refers to the accompanying drawings.

DETAILED DESCRIPTION OF EMBODIMENTS OF THE INVENTION

Figure 1:
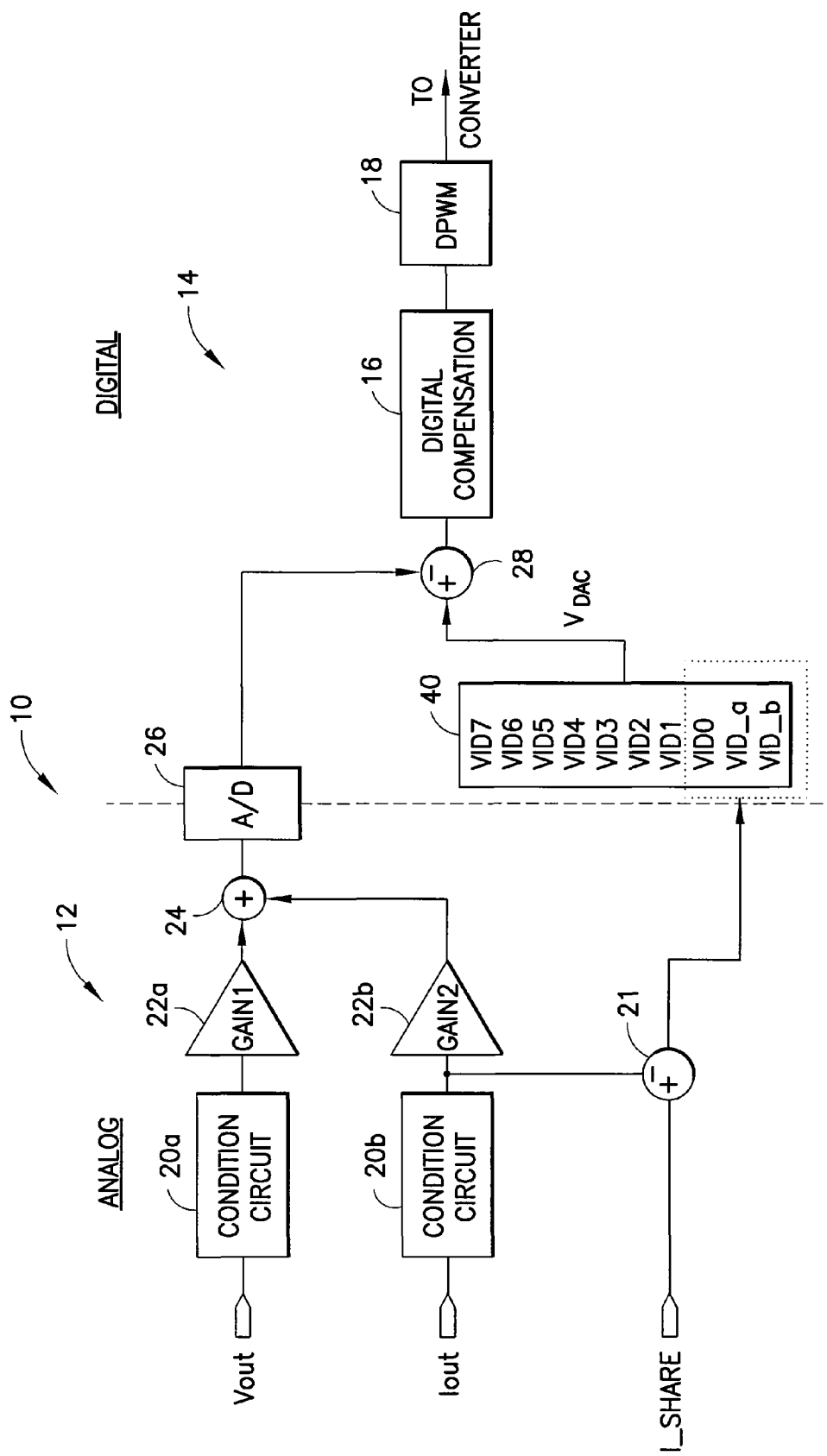
FIG. 1 is a block diagram of a digital PWM control circuit of one embodiment of the present invention.

As illustrated in FIG. 1, a digital PWM control circuit 10 of the present invention is used to process output voltage and current $V_{OUT}$ and $I_{OUT}$ in an analog front-end circuit 12 to achieve desired AVP or output characteristics. AVP stands for Active Voltage positioning, and refers to the characteristic desired in voltage converters of reducing the output voltage slightly at higher currents to position the output voltage for maximizing converter efficiency. The other output characteristics include output voltage and output phase currents, for example.

Referring to FIG. 1, the processed voltage and current are fed into an ADC circuit 26 to start digital processing in a digital circuit 14, i.e., compensation in a digital compensation circuit 16 and digital Pulse Width Modulation in a circuit 18.

Figure 2:
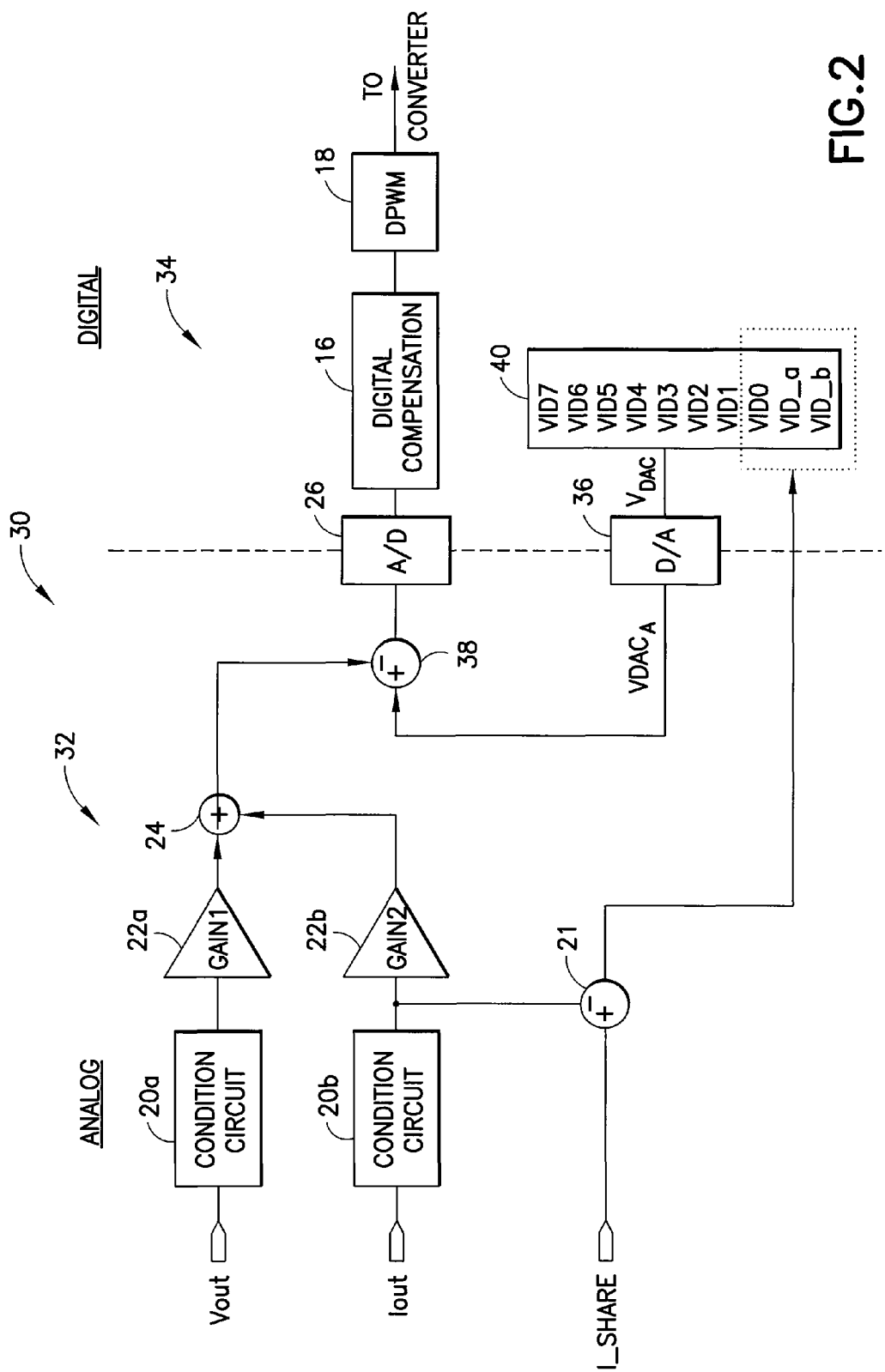
FIG. 2 is a block diagram of a digital PWM control circuit of another embodiment of the present invention.

Alternatively, as illustrated in FIG. 2, a digital PWM control circuit 30 of the present invention is used to process output voltage and current $V_{OUT}$ and $I_{OUT}$ in an analog front-end circuit 32 to achieve desired AVP or output characteristics. And then, the processed voltage and current are fed into an ADC circuit 26 to start digital processing in a digital circuit 34 in the digital compensation circuit 16 and digital Pulse Width Modulation in circuit 18.

In both circuits 12 and 32, shown in FIGS. 1 and 2, an output current $I_{OUT}$ and an output voltage $V_{OUT}$ are first pre-conditioned in condition circuits 20a and 20b, then processed in gain circuits 22a and 22b, and finally summed up in a summing circuit 24 to achieve desired output characteristics in an analog circuit 12.

In FIG. 1, thus conditioned, processed, and summed up analog signal resulting from output current $I_{OUT}$ and voltage $V_{OUT}$ is fed directly into an A/D converter circuit 26 to produce a digital signal. The resulting digital signal from the A/D converter 26 is then compared with the digital signal $V_{DAC}$ from a VID (voltage identification circuit) to which sets the desired converter output voltage. Typically, the VID signal is a plurality of digital bits set by the microprocessor being supplied with power by the converter to determine the processor supply voltage. The differential circuit 28 generates an error signal to regulate the converter voltage to the desired level set by the VID circuit 40 from the output voltage reference $V_{DAC}$ provided by the digital VID circuit 40. The error signal from the differential circuit 28 is then compensated by a digital compensation circuit 16 and then provided to a digital PWM circuit 18 to provide the PWM control for the converter.

The output voltage reference $V_{DAC}$ provided by the digital VID circuit 40 is modified by a signal from a differential circuit 21, which compares the output current $I_{OUT}$ processed in the condition circuit 20b and an average output current $I_{SHARE}$. The output of the comparison circuit 21 is used to update the least significant bits (LSB) of the output voltage reference $V_{DAC}$ of the digital VID circuit 40. For example, if a phase output current is less than the average output current $I_{SHARE}$, the least significant bits VID_b, VID_a, or VID0 of the reference value are changed to change the reference voltage to increase the current supplied by that phase.

In the embodiment of FIG. 1, the voltage regulation is performed digitally, i.e., the digital $V_{DAC}$ reference signal is compared to the digitized output of the A/D converter 26 representing the sensed converter output characteristics, i.e., voltage current.

In the embodiment of FIG. 2, in contrast, the regulation is performed in the analog domain, i.e., the digital VDAC signal is converted to an analog signal and then compared in the analog domain to the sensed converter output characteristics.

Accordingly, in the embodiment, illustrated in FIG. 2, the resulting analog signal summed up in the summing circuit 24 is compared in the error circuit 38 with the output voltage reference $V_{DAC}$ provided by the digital VID circuit 40 and converted by a D/A converter circuit 36 to analog $V_{DACA}$, to generate the error signal. The error signal from circuit 38 is then fed into the A/D converter circuit 26 to produce a digital signal. Then, as in the circuit 14 of FIG. 1, the resulting digital signal from the A/D converter 26 is compensated by the digital compensation circuit 16 and a digital PWM control signal is generated by digital PWM circuit 18 to control the converter output voltage. Also, as in circuit 12, the average output current $I_{SHARE}$ is compared to the output current $I_{OUT}$ processed in the condition circuit 20b in the differential circuit 21 with the resulting signal being provided to the digital VIED circuit 40 to change the VID signal depending on the relationship of the phase current to the average current $I_{SHARE}$.

In both embodiments, illustrated in FIGS. 1 and 2, the average output current $I_{SHARE}$ is calculated as a total output current divided by a number of phases.

Figure 3:
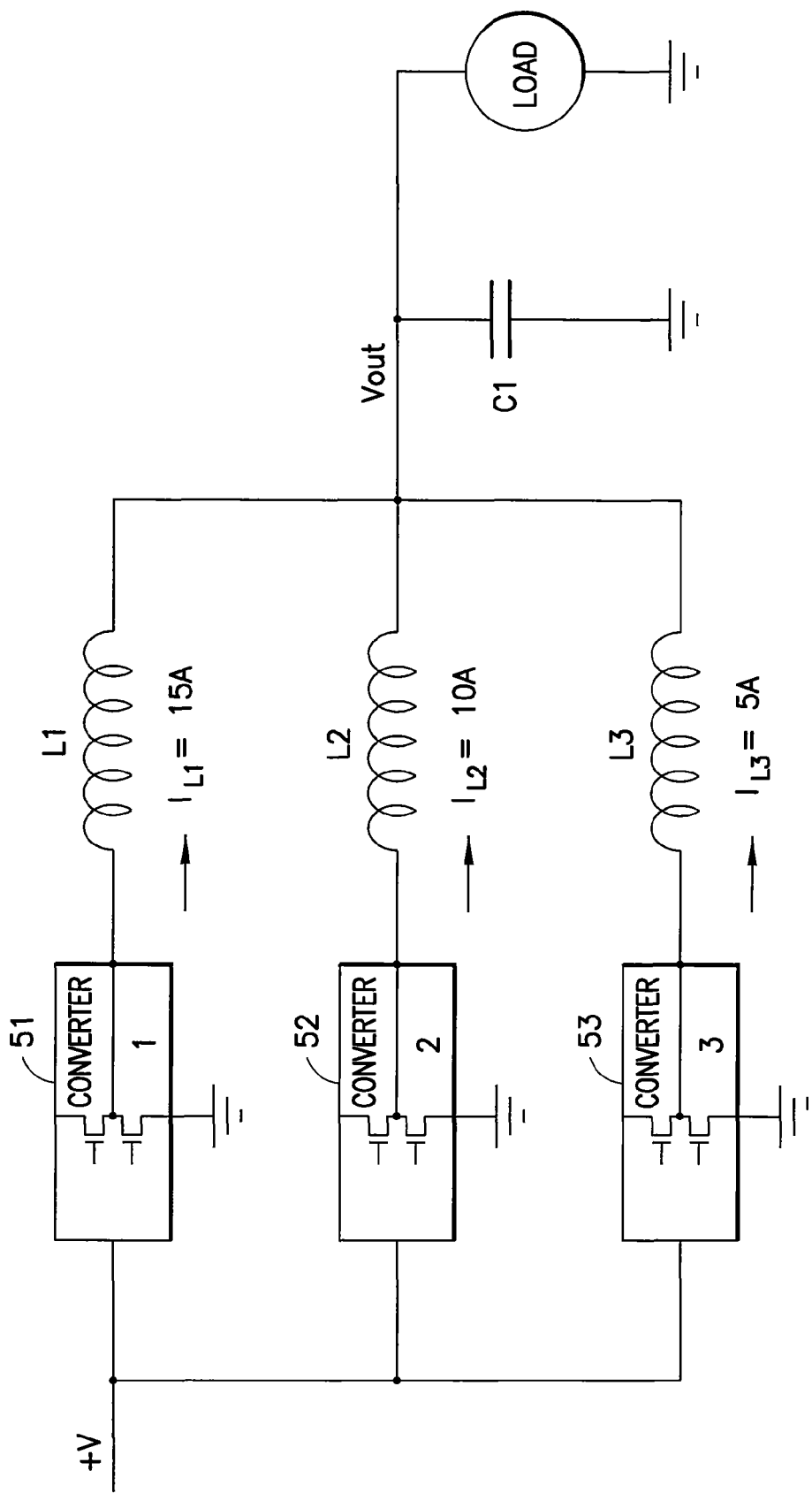
FIG. 3 is a diagram of a multi-phase converter controlled by an embodiment of the present invention illustrated in FIGS. 1 and 2.

As illustrated in FIG. 3, currents $I_{L1}$, $I_{L2}$, and $I_{L3}$ from each inductor L1, L2, and L3 are compared to the average current $I_{SHARE}$ and the LSBS are adjusted. In the example of FIG. 3, which shows a three-phase converter, say there are three inductors having currents at 5 A, 10 A, and 15 A. The average current $I_{SHARE}$ would be 10 A. Thus in converter 51 the average current $I_{SHARE}$ will be compared to inductor L1 current $I_{L1}$. If the current $I_{L1}$ is too high, then an output of the comparison circuit 21 (FIGS. 1 and 2) will drive the digital VID circuit 40 (FIGS. 1 and 2) to decrease the current in that converter 51 to the average current $I_{SHARE}$. If, for example, current $I_{L3}$ is too low, as in converter 53, then the output of the comparison circuit 21 will drive the digital VID circuit 40 to increase the current in that converter 53.

The above described embodiments result in one high speed A/D converter circuit 26 saving the die size and also reducing the power consumption of the digital PWM control circuits 10, 30 (FIGS. 1 and 2). In addition, current sharing among the paralleled control circuit is achieved by taking advantage of VID settings. Further, a single wire shared bus makes the architecture of the digital PWM control circuits 10, 30 simple and robust.

Further, to achieve current sharing among the paralleled converters 51, 52, and 53 the output voltage reference $V_{DAC}$, is updated within a window of the digital VID circuit 40 as illustrated in FIGS. 1 and 2, with discrete steps depending on whether the output current is larger or smaller than the average output current $I_{SHARE}$.

Additionally, analog counterparts to the digital PWM control circuit have AVP and current sharing capability that have been widely used in CPU processor power supplies. However, these counterparts require many more external components and lack flexibility to implement advanced control algorithms.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A control circuit for a multi-phase converter, the multi-phase converter comprising a plurality of converter circuits, the control circuit comprising:
   an analog front-end circuit for receiving and processing an output voltage and a current of one of the plurality of converter circuits and an average output current;
   a digital circuit for producing an output voltage reference for setting a desired output voltage of the one of the plurality of converter circuits, said digital circuit configured to modify said output voltage reference value according to a signal from said analog front-end circuit; and
   an error circuit for comparing the output voltage reference and a parameter related to said output voltage and current for generating control signals for controlling the one of the plurality of converter circuits, said error circuit including no more than one Analog to Digital Converter circuit, further comprising a digital PWM generation circuit controlled by said Analog to Digital converter circuit for generating digital control signals for controlling the one of the plurality of converter circuits.

2. The circuit of claim 1, further comprising an updating circuit to update least significant bits (LSB) of the output voltage reference, wherein the LSB of the output voltage reference are changed to increase the output current if the output current is less than the average output current, and changed to decrease the output current if the output current is greater than the average output current.

3. The circuit of claim 2, wherein the average output current is calculated as a total of output currents of the plurality of converter circuits divided by a number of the plurality of converter circuits.

4. The circuit of claim 1, wherein the analog front-end circuit further comprises:
   at least one conditioning circuit for preconditioning the output voltage and current;
   at least one gain circuit for processing the preconditioned output voltage and current;
   a summing circuit for summing the processed preconditioned output voltage and current; and
   a current share error circuit for comparing the preconditioned output current and the average output current value.

5. The circuit of claim 1, wherein the error circuit comprises a digital error circuit that receives the output voltage reference as a digital signal and the parameter related to said output voltage and current as a digital parameter from said Analog to Digital converter and provides a digital error signal.

6. The circuit of claim 1, wherein the error circuit comprises an analog error circuit that receives the output voltage reference as an analog signal from a digital to analog converter that receives the output voltage reference as a digital signal and the analog error circuit further receiving said parameter related to the output voltage and current as an analog parameter and provides an analog error signal to said Analog to Digital converter.

7. The circuit of claim 4, further comprising:
   a digital compensation circuit for providing a compensated digital signal for controlling the one of the plurality of converter circuits; and
   a pulse width modulation circuit for modulating the compensated digital signal.

8. The circuit of claim 5, further comprising a digital pulse width modulation stage for receiving said digital error signal for providing a digital PWM signal to control the one of the plurality of converter circuits.

9. The circuit of claim 8, further comprising a digital compensation stage processing said digital error signal.

10. The circuit of claim 6, further comprising a digital pulse width modulation stage receiving the output of said analog to digital converter as a digital error signal and for connecting said digital error signal to a digital PWM signal to control the converter.

11. The circuit of claim 10, further comprising a digital compensator stage processing said digital error signal.

12. The circuit of claim 1, wherein the circuit provides current sharing amongst the converters.

13. The circuit of claim 1, wherein the circuit provides AVP.

14. The circuit of claim 1, wherein the average output current is present on a single wire shared bus connecting all the converters.

* * * * *